US012805022B2

(12) United States Patent
Pandey et al.

(10) Patent No.: US 12,805,022 B2
(45) Date of Patent: Nov. 17, 2026

(54) HIGH PERFORMANCE SILICON CONTROLLED RECTIFIER DEVICES

(71) Applicant: GlobalFoundries U.S. Inc., Malta, NY (US)

(72) Inventors: Shesh Mani Pandey, Saratoga Springs, NY (US); Sagar Premnath Karalkar, Singapore (SG); Rajendran Krishnasamy, Essex Junction, VT (US); Anindya Nath, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 564 days.

(21) Appl. No.: 18/118,323

(22) Filed: Mar. 7, 2023

(65) Prior Publication Data

US 2024/0304612 A1 Sep. 12, 2024

(51) Int. Cl.
*H10D 89/60* (2025.01)

(52) U.S. Cl.
CPC ................................ *H10D 89/713* (2025.01)

(58) Field of Classification Search
CPC .... H10D 89/713; H10D 62/115; H10D 8/041; H10D 8/80
See application file for complete search history.

(56) References Cited

U.S. PATENT DOCUMENTS

2001/0036690 A1 11/2001 Maeda
2003/0213971 A1 11/2003 Yu
2011/0147794 A1 6/2011 Gauthier, Jr. et al.
2012/0043583 A1* 2/2012 Abou-Khalil ........ H10D 89/713 716/121
2013/0161757 A1 6/2013 Huang et al.
2014/0015052 A1 1/2014 Fenouillet-Beranger et al.
2014/0349464 A1 11/2014 Yang et al.
2015/0084094 A1 3/2015 Menard
2015/0187749 A1 7/2015 Dai
(Continued)

FOREIGN PATENT DOCUMENTS

CN 102157519 A 8/2011
CN 106876369 A * 6/2017 ........... H10D 89/713
CN 110085573 A * 8/2019 ............. H10D 89/60

OTHER PUBLICATIONS

The Extended European Search Report and Opinion dated Jul. 16, 2024 for EP Application No. 24152507.0-1211, 7 Pages.
(Continued)

*Primary Examiner* — Fernando L Toledo
*Assistant Examiner* — Marshall Mu-Nuo Hatfield
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to high performance silicon controlled rectifier (SCR) devices and methods of manufacture. The structure includes: a first well in a semiconductor substrate; a second well in the semiconductor substrate, adjacent to the first well; a plurality of shallow trench isolation structures extending into the first well and the second well; and a deep trench isolation structure between the plurality of shallow trench isolation structures and extending into the semiconductor material deeper than the plurality of shallow trench isolation structures.

11 Claims, 7 Drawing Sheets

(56) References Cited

U.S. PATENT DOCUMENTS

| | | | | |
|---|---|---|---|---|
| 2016/0013205 | A1 | 1/2016 | Vinet et al. | |
| 2019/0165170 | A1 | 5/2019 | Sambi et al. | |
| 2019/0280086 | A1* | 9/2019 | Karp | H10D 84/038 |
| 2020/0135715 | A1* | 4/2020 | Loiseau | H10D 18/251 |
| 2020/0243507 | A1 | 7/2020 | Russ et al. | |
| 2023/0044360 | A1* | 2/2023 | Zhao | H10D 30/603 |

OTHER PUBLICATIONS

The Extended European Search Report and Opinion dated Jul. 16, 2024 for EP Application No. 24152505.4-1211, 7 Pages.

Gianluca Boselli et al., "Latch-Up in 65NM Cmos Technology: a Scaling Perspective", IEEE 43rd Annual International Reliability Physics Symposium, San Jose, 2005, 8 pages.

Vaschenko et al., "Multi-port ESD protection using bi-directional SCR structures", IEEE, Conference: Bipolar/BiCMOS Circuits and Technology Meeting, Oct. 2003, Abstract, 3 pages.

Jung et al., "A Design of BJT-based ESD Protection Device combining SCR for High Voltage Power Clamp", Journal of Semiconductor Technology and Science, Jun. 30, 2014, vol. 14, No. 3, 6 pages.

Do et al., "A New Dual-Direction SCR with High Holding Voltage and Low Dynamic resistance for 5V Application", Electron Devices Society, May 13, 2019, vol. 7, 5 pages.

Specification and Drawings filed on Feb. 21, 2023 in U.S. Appl. No. 18/111,959, 23 pages.

Non-Final Office Action dated Jun. 4, 2025 in U.S. Appl. No. 18/111,959 21 pages.

Office Action dated Jan. 15, 2026 in U.S. Appl. No. 18/111,959, 13 pages.

* cited by examiner

HIGH PERFORMANCE SILICON CONTROLLED RECTIFIER DEVICES

BACKGROUND

The present disclosure relates to semiconductor structures and, more particularly, to high performance silicon controlled rectifier (SCR) devices and methods of manufacture.

A silicon controlled rectifier (SCR) is a solid-state current-controlling device, which is a unidirectional device (i.e., can conduct current only in one direction). The SCR typically includes a switching configuration comprising p-n-p-n layers.

A holding current of an SCR can be defined as the smallest amount of current under which an anode current has to drop to enter an OFF status. This means if the holding current value is 5 mA, for example, subsequently the SCR's anodes' current has to turn into less than 5 mA to discontinue performing. A triggering voltage, on the other hand, may occur when the anode terminal is made +ve relating to the cathode in which case the SCR will be in a forwarding biased mode, e.g., enters into the forward blocking state. This means the device is switched from the blocked (OFF) state to the unblocked (ON) state.

SUMMARY

In an aspect of the disclosure, a structure comprises: a first well in a semiconductor substrate; a second well in the semiconductor substrate, adjacent to the first well; a plurality of shallow trench isolation structures extending into the first well and the second well; and a deep trench isolation structure between the plurality of shallow trench isolation structures and extending into the semiconductor material deeper than the plurality of shallow trench isolation structures.

In an aspect of the disclosure, a structure comprises: a p-well in a semiconductor substrate; an n-well in the semiconductor substrate and abutting the p-well; first diffusion regions in the n-well connecting to an anode; second diffusion regions in the p-well and connecting to a cathode; shallow trench isolation structures extending into the n-well and the p-well; and a deep trench isolation structure between the shallow trench isolation structures and which is deeper than the shallow trench isolation structures.

In an aspect of the disclosure, a method comprises: forming a first well in a semiconductor substrate; forming a second well in the semiconductor substrate, adjacent to the first well; forming a plurality of shallow trench isolation structures extending into the first well and the second well; and forming a deep trench isolation structure between the plurality of shallow trench isolation structures and extending into the semiconductor material deeper than the plurality of shallow trench isolation structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high performance silicon controlled rectifier (SCR) devices and methods of manufacture. In embodiments, the SCR devices include a deep trench isolation structure extending into a well, e.g., N-well, P-well or junction of the N/P wells, within semiconductor material, e.g., silicon. Advantageously, in these configurations, the SCR devices are high holding SCR devices which exhibit a lower trigger voltage compared to conventional SCR devices. For example, the high current performance is due to a deeper current path resulting from the use of the deep trench isolation structure. Moreover, the use of the deep trench isolation structure effectively provides a smaller footprint compared to conventional SCR devices.

In more specific embodiments, the SCR device includes a first terminal in a first well and a second terminal in a second well adjacent to the first well. The first well abuts the second well along an interface or junction. The first terminal may be an anode and the second terminal may be a cathode. A deep trench isolation structure is provided in one of the wells and, more preferably, at the junction of the first well and the second well. In embodiments, the deep trench isolation structure separates the anode from the cathode and will allow the current to be pushed deeper into the semiconductor substrate to block current and increase the high holding voltage. The SCR device further comprises shallow trench isolation structures between the first terminal and the second terminal, with the deep trench isolation structure being deeper than the shallow trench isolation structures.

The SCR devices of the present disclosure can be manufactured in a number of ways using a number of different tools. In general, though, the methodologies and tools are used to form structures with dimensions in the micrometer and nanometer scale. The methodologies, i.e., technologies, employed to manufacture the SCR devices of the present disclosure have been adopted from integrated circuit (IC) technology. For example, the structures are built on wafers and are realized in films of material patterned by photolithographic processes on the top of a wafer. In particular, the fabrication of the SCR devices uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
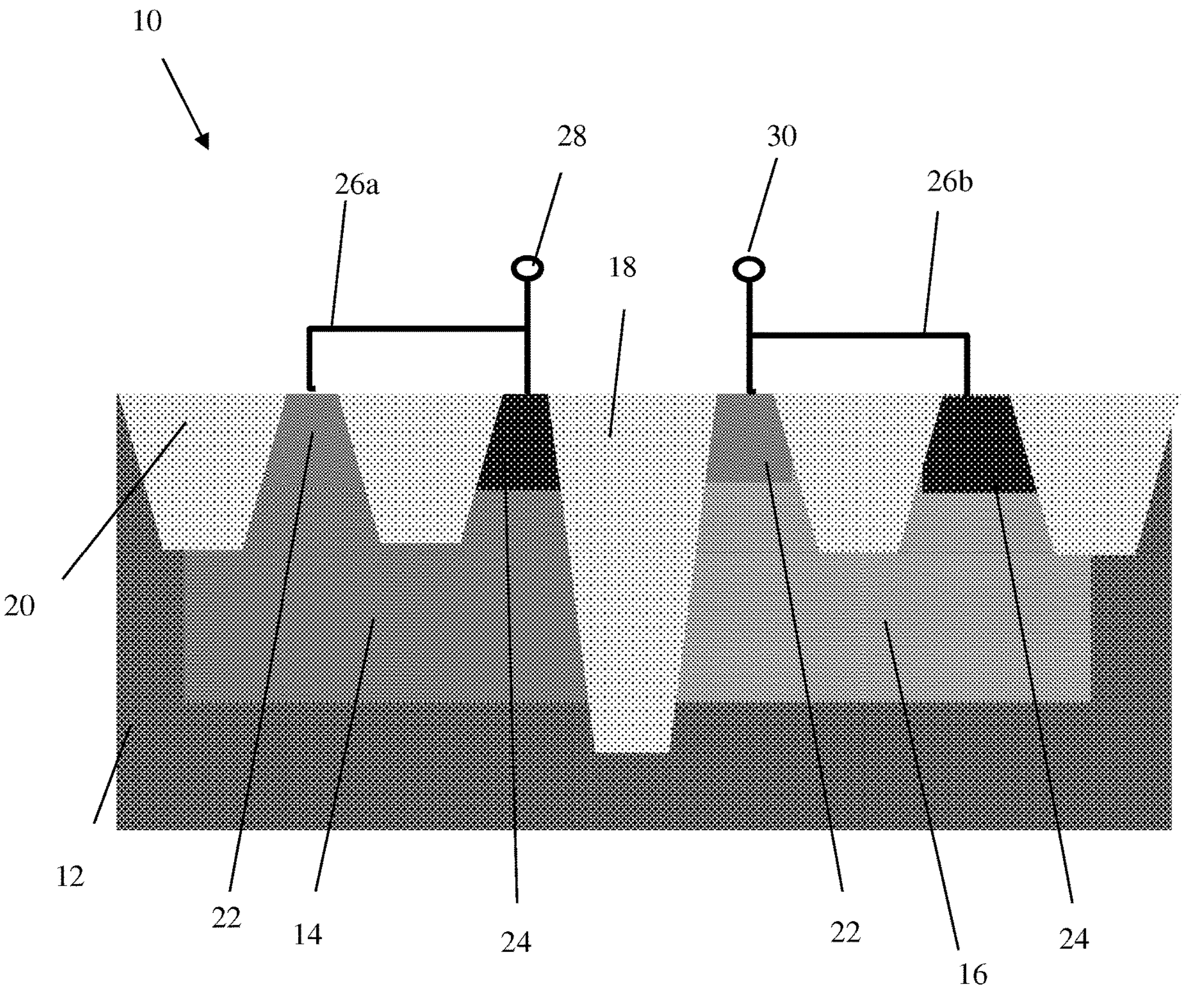
FIG. 1 shows a silicon controlled rectifier (SCR) device with a deep trench isolation structure and respective fabrication processes in accordance with aspects of the present disclosure.

FIG. 1 shows an SCR device with a deep trench isolation structure and respective fabrication processes in accordance with aspects of the present disclosure. In particular, the structure 10 of FIG. 1 includes a semiconductor substrate 12 composed of any suitable material including, but not limited to, Si, SiGe, SiGeC, SiC, GaAs, InAs, InP, and other III/V or II/VI compound semiconductors. The semiconductor substrate 12 may be a lightly doped p-type semiconductor substrate. In more specific embodiments, the semiconductor substrate 12 may be a lightly doped p-type, single crystalline Si substrate with any suitable crystallographic orientation (e.g., a (100), (110), (111), or (001) crystallographic orientation).

The semiconductor substrate 12 may include wells 14, 16. In embodiments, the well 14 may be an N-well and the well 16 may be a P-well. In embodiments, the wells 14, 16 are abutting. As described in more detail with respect to FIG. 7C, the wells 14, 16 may be formed by introducing different dopant types into the semiconductor substrate 12 by, for example, ion implantation processes.

A deep trench isolation structure 18 may be provided at the interface or junction of the wells 14, 16. In more specific embodiments, the deep trench isolation structure 18 may extend laterally into both the wells 14, 16, extending from a top surface of the semiconductor substrate 12. In embodiments, the deep trench isolation structure 18 may extend completely through the wells 14, 16 and into the underlying semiconductor substrate 12. It is also contemplated that other depths of the deep trench isolation structure can be implemented in the present disclosure depending on the desired breakdown voltage. Accordingly, the depth of the deep trench isolation structure 18 may be adjusted to different depths at the interface or junction of the wells 14, 16, depending on required device characteristics.

Still referring to FIG. 1, shallow trench isolation structures 20 may be provided within the semiconductor substrate 12. In embodiments, the shallow trench isolation structures 20 extend vertically into the wells 14, 16 and isolate diffusion regions 22, 24. In embodiments, the diffusion regions 22 are N+ diffusion regions and the diffusion regions 24 are P+ diffusion regions, each of which vertically extend into the semiconductor substrate 12 and, more specifically, within the wells 14, 16. In embodiments, the shallow trench isolation structures 20 are not as deep as the deep trench isolation structure 18.

FIG. 1 also representatively shows contacts and/or wiring structures 26*a* to an anode 28 and contacts and/or wiring structures 26*b* to a cathode 30. In embodiments, the anode 28 is electrically connected to the diffusion regions 22, 24 of the N-well 14 and the cathode 30 is connected to the diffusion regions 22, 24 of the P-well 16. The contacts and/or wiring structures 26*a*, 26*b* may electrically connect to silicide contacts on the diffusion regions 22, 24.

As should be understood by those of skill in the art, the silicide contacts may be formed by a silicide process which begins with deposition of a thin transition metal layer, e.g., nickel, cobalt or titanium, over fully formed and patterned semiconductor devices (e.g., doped or ion implanted diffusion regions). After deposition of the material, the structure is heated allowing the transition metal to react with exposed silicon (or other semiconductor material as described herein) in the active regions of the semiconductor device (e.g., doped or ion implanted diffusion regions) forming a low-resistance transition metal silicide. Following the reaction, any remaining transition metal is removed by chemical etching, leaving silicide contacts in the active regions of the device.

Figure 2:
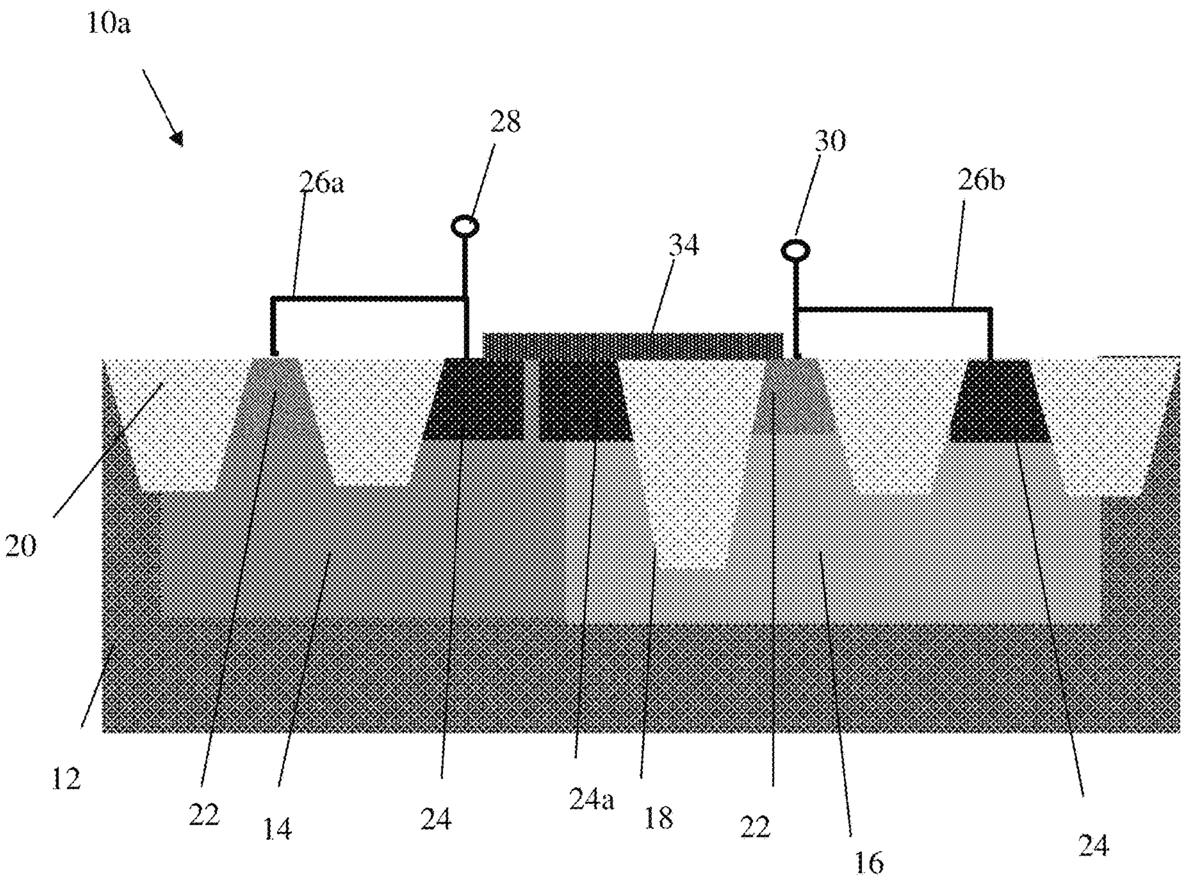
FIG. 2 shows an SCR device with a deep trench isolation structure in a P-well in accordance with additional aspects of the present disclosure.

FIG. 2 shows another SCR device with a deep trench isolation structure. In the structure 10*a* of FIG. 2, the deep trench isolation structure 18 may extend completely within the well 16. In addition, a diffusion region 24*a* may be provided at the junction of the wells 14, 16 to provide low and mid voltage breakdown voltage characteristics. In this embodiment, the deep trench isolation structure 18 isolates the diffusion region 24*a* and 22. Also, in this embodiment, the diffusion region 24*a* is a P+ diffusion region and, as in the previous embodiment, the well 16 may be P-well.

Still referring to FIG. 2, a silicide blocking material 34, e.g., nitride or oxide, may be formed over the diffusion region 24*a* (and deep trench isolation structure) to prevent silicide formation. As in any of the embodiments, the silicide blocking material 34 may extend over the surface of the semiconductor substrate 12 and shallow trench isolation structures 20 (excluding locations which electrically connect to the contacts 26*a*, 26*b* for an anode and cathode). Moreover, the depth of the deep trench isolation structure 18 may be adjusted to a depth with the wells or below the wells into the semiconductor substrate 12 for adjustments to the holding voltage. Also, the breakdown voltage may be determined by the floating P+/NW junction. The remaining features are similar to the structure 10 of FIG. 1.

Figure 3:
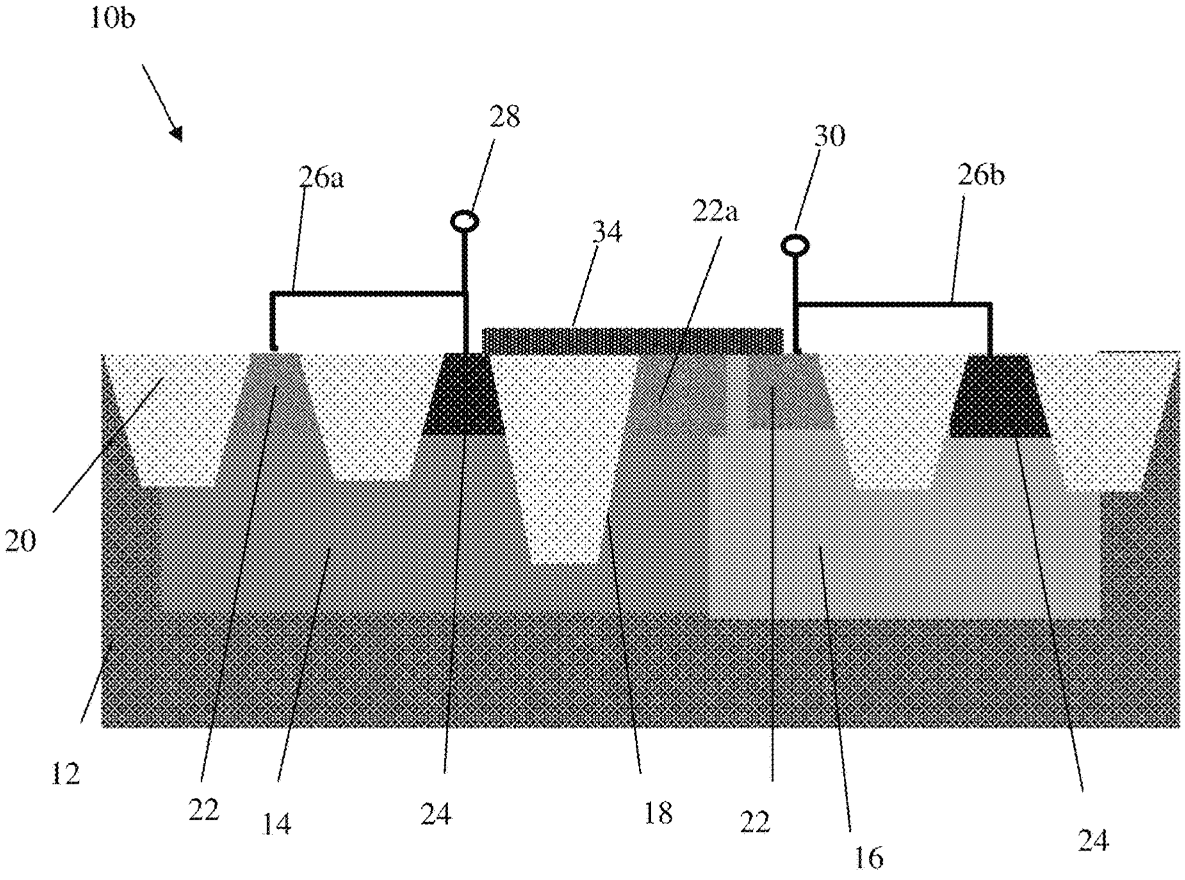
FIG. 3 shows an SCR device with a deep trench isolation structure in an N-well in accordance with additional aspects of the present disclosure.

FIG. 3 shows yet another SCR device with a deep trench isolation structure. In the structure 10*b* of FIG. 3, the deep trench isolation structure 18 may extend completely within the well 14, e.g., N-well. In addition, a diffusion region 22*a* may be provided at the junction of the wells 14, 16 to provide low and mid voltage breakdown voltage characteristics. The silicide blocking material 34, e.g., nitride or oxide, may be formed over the diffusion region 24*a* (and deep trench isolation structure) to prevent silicide formation. In embodiments, the deep trench isolation structure 18 isolates the diffusion region 24 and 22*a*. In this embodiment, the diffusion region 22*a* is an N+ diffusion region. The remaining features are similar to the structure 10*b* of FIG. 2.

Figure 4:
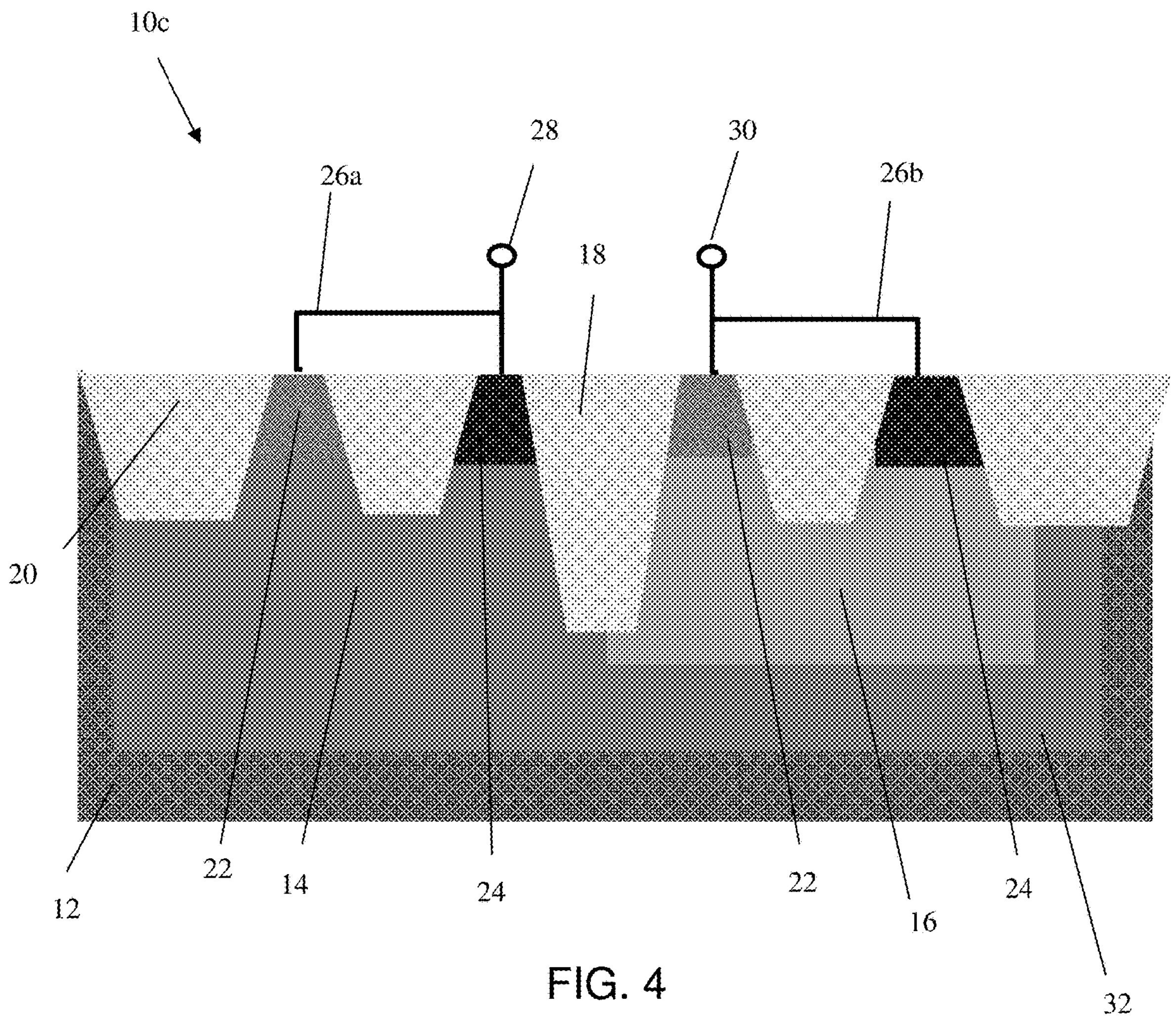
FIG. 4 shows an SCR device with the deep trench isolation structure of FIG. 1 in a deep N-well in accordance with aspects of the present disclosure.

FIG. 4 shows an SCR device with the deep trench isolation structure of FIG. 1 in a deep N-well 32. In the structure 10*c* of FIG. 4, the deep N-well 32 is provided within the semiconductor substrate 12, which isolates the SCR device. In more specific embodiments, the wells 14, 16 and deep trench isolation structure 18 sit within the deep N-well 32, which isolates the SCR from other devices. The deep N-well 32 may be formed by a conventional ion implantation process as is known in the art and described herein. The remaining features of the structure 10*b* are similar to the structure 10 of FIG. 1.

Figure 5:
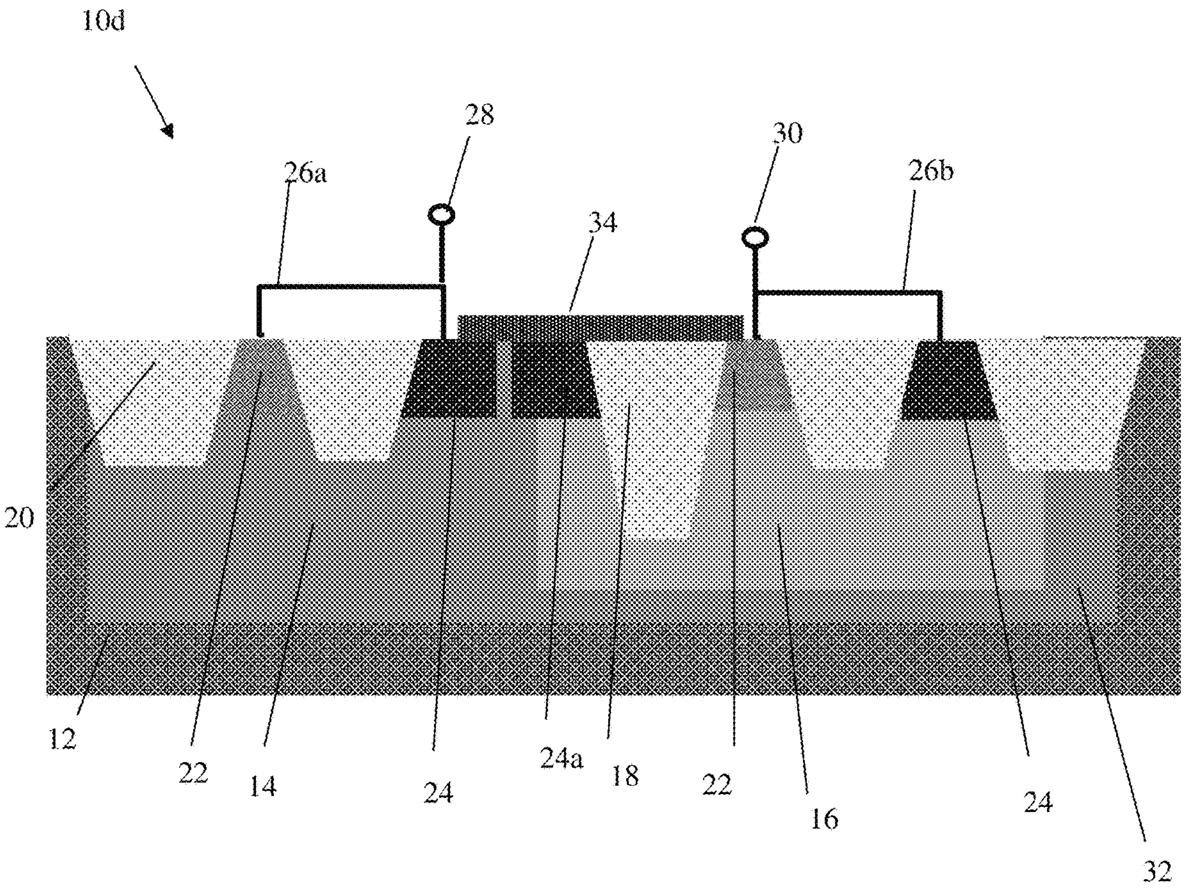
FIG. 5 shows an SCR device with the deep trench isolation structure of FIG. 2 in a deep N-well in accordance with aspects of the present disclosure.

FIG. 5 shows an SCR device with the deep trench isolation structure of FIG. 2 in a deep N-well 32. In the structure 10*d* of FIG. 5, the deep N-well 32 is provided within the semiconductor substrate 12, which isolates the SCR device. In more specific embodiments, the wells 14, 16 and deep trench isolation structure 18 sit within the deep N-well 32 to isolate the SCR from other devices. The remaining features of the structure 10*d* are similar to the structure 10*a* of FIG. 2.

Figure 6:
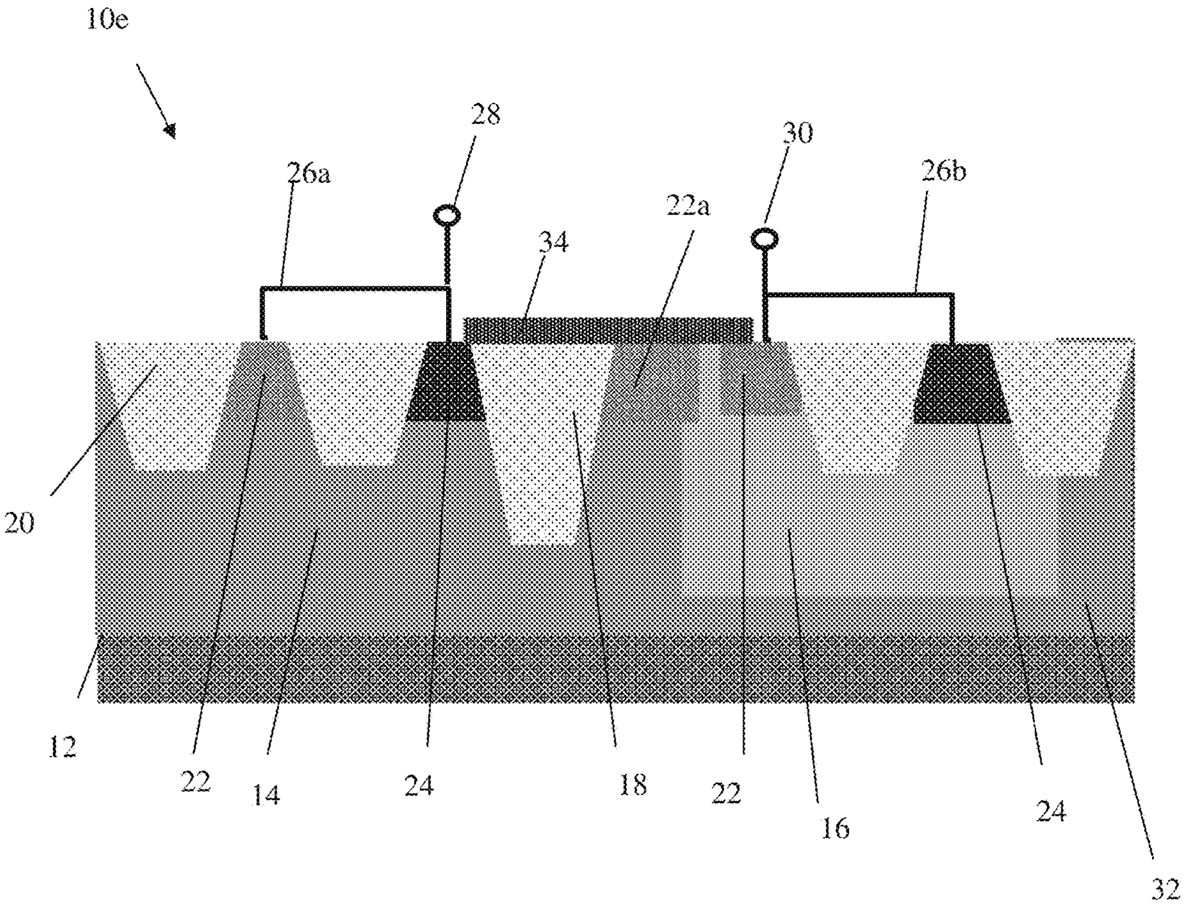
FIG. 6 shows an SCR device with the deep trench isolation structure of FIG. 3 in a deep N-well in accordance with aspects of the present disclosure.

FIG. 6 shows an SCR device with the deep trench isolation structure of FIG. 3 in a deep N-well 32. In the structure 10*e* of FIG. 6, the deep N-well 32 is provided within the semiconductor substrate 12, which again is used to isolate the SCR device. In more specific embodiments, the wells 14, 16 and deep trench isolation structure 18 sit within the deep N-well 32. The remaining features of the structure 10_e_ are similar to the structure 10_b_ of FIG. 3.

In each of the embodiments, the deep trench isolation structure 18 will provide a higher resistance for carriers, and will exhibit a lower capacitance than the semiconductor substrate 12. The deep trench isolation structure 18 will allow the current to be pushed deeper into the semiconductor substrate 12 than conventional structures to block current and increase the high holding voltage.

Figure 7A:
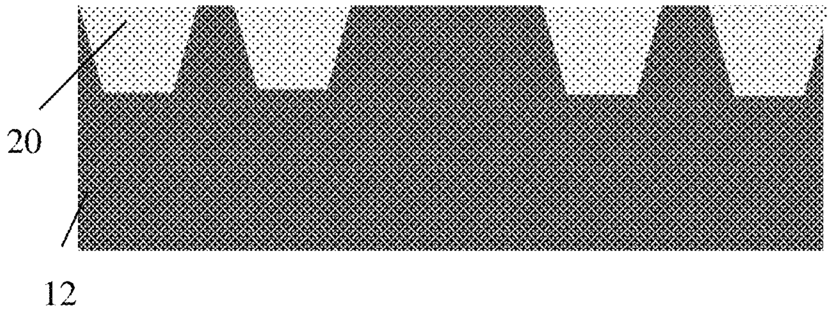
FIGS. 7A-7C show fabrication processes for manufacturing the SCR device of FIG. 1 in accordance with aspects of the present disclosure.
Figure 7B:
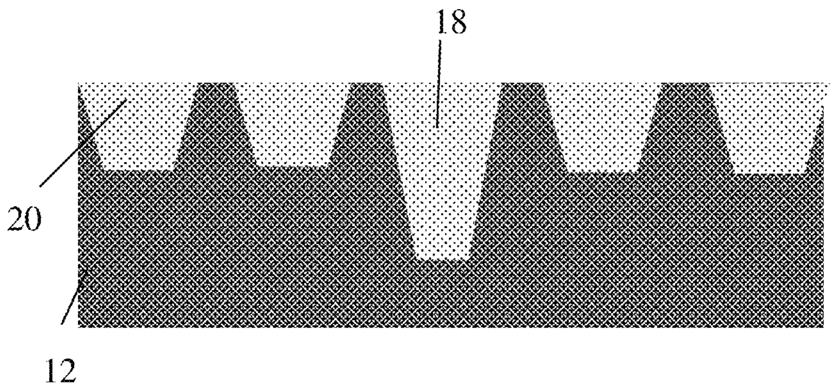
Figure 7C:
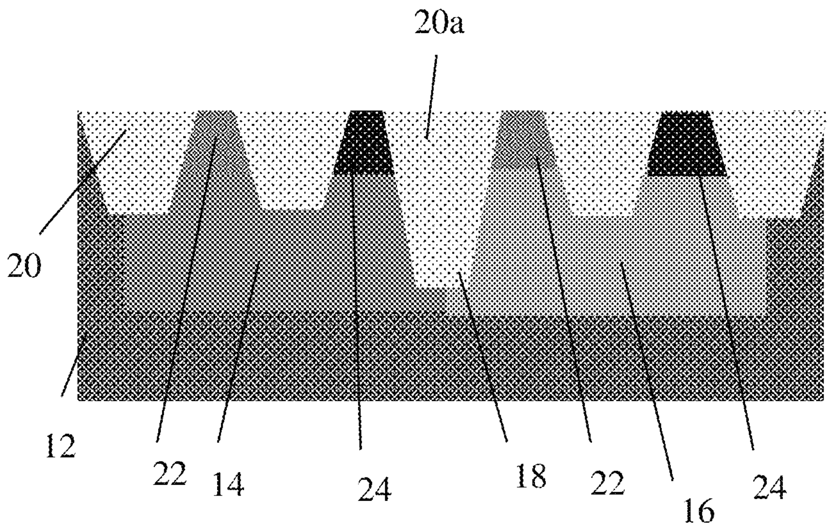

FIGS. 7A-7C show fabrication processes for manufacturing the SCR device of FIG. 1. Similar processes can be used to fabricate the devices of FIGS. 2-6. In FIG. 7A, for example, the shallow trench isolation structures 20 are formed within the semiconductor substrate 12. In embodiments, the shallow trench isolation structures 20 may be positioned to extend within wells 14, 16 and isolate diffusion regions 22, 24, each of which are formed in later fabrication processes as shown in FIG. 7C.

The shallow trench isolation structures 20 can be formed by conventional lithography, etching and deposition methods known to those of skill in the art. For example, a resist formed over the semiconductor substrate 12 is developed to form a pattern (opening). An etching process with a selective chemistry, e.g., reactive ion etching (RIE), will be used to transfer the pattern from the patterned photoresist layer to the semiconductor substrate 12. Following the resist removal by a conventional oxygen ashing process or other known stripants, insulator material (e.g., $SiO_2$) can be deposited by any conventional deposition processes, e.g., chemical vapor deposition (CVD) processes within the respective trenches. Any residual material on the surface of the semiconductor material 12 can be removed by conventional chemical mechanical polishing (CMP) processes.

In FIG. 7B, the deep trench isolation structure 18 is formed within the semiconductor substrate 12. As with the shallow trench isolation structures 20, the deep trench isolation structure 18 can be formed by conventional lithography, etching and deposition methods known to those of skill in the art. In embodiments, the deep trench isolation structure 189 can be fabricated prior to the fabrication of the shallow trench isolation structures 20.

The deep trench isolation structure 18 will extend into the semiconductor substrate 12 deeper than the shallow trench isolation structures 20. The deep trench isolation structure 18 can be formed to align with either well 14, 16 or a junction between the wells as shown in FIGS. 1-4. In addition, depending on the desired performance characteristics, the deep trench isolation structure 18 may extend to different depths, any of which would be deeper than the shallow trench isolation structures 20.

FIG. 7C shows the fabrication processes of forming the wells 14, 16 and diffusion regions 22, 24 (and also diffusion regions 22_a_, 24_a_). The wells 14, 16 and diffusion regions 22, 24 may be formed by introducing a concentration of a different dopant of opposite conductivity type in the semiconductor substrate. The wells 14, 16 will abut one another; whereas the diffusion regions 22, 24 will be provided between the shallow trench isolation structures 20 and within the wells 14, 16.

In embodiments, respective patterned implantation masks may be used to define selected areas exposed for the implantations of the wells 14, 16 and diffusion regions 22, 24. The implantation mask used to select the exposed area for forming a well and/or diffusion regions is stripped after implantation, and before the implantation mask used to form another well or diffusion region of different conductivity type. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P-well 16 and p-diffusion regions 24 may be doped with different concentrations of p-type dopants, e.g., Boron (B), and the N-well 14 and n-diffusion regions 22 may be doped with different concentrations of n-type dopants, e.g., Arsenic (As), Phosphorus (P) and Antimony (Sb), among other suitable examples. An annealing process may be performed to drive in the dopant into the semiconductor substrate 12.

Referring back to FIG. 1, the contacts and/or wiring structures 26_a_, 26_b_ may be formed by conventional back end of the line (BEOL) processes. For example, an interlevel dielectric material may be deposited over the semiconductor substrate 12, which is then subjected to lithography and etching processes (e.g., RIE), followed by deposition of metal or metal alloy material, e.g., tungsten with a TaN or TiN liner. Any residual metal or metal alloy material on the interlevel dielectric material may be removed by a conventional chemical mechanical polishing (CMP) process.

As should be understood by those of skill in the art, the silicide process begins with deposition of a thin transition metal layer, e.g., nickel, cobalt or titanium, over fully formed and patterned semiconductor devices (e.g., doped or ion implanted diffusion regions). After deposition of the material, the structure is heated allowing the transition metal to react with exposed silicon (or other semiconductor material as described herein) in the active regions of the semiconductor device (e.g., doped or ion implanted diffusion regions) forming a low-resistance transition metal silicide. Following the reaction, any remaining transition metal is removed by chemical etching, leaving silicide contacts in the active regions of the device.

The SCR devices can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a first well in a semiconductor substrate;

a second well in the semiconductor substrate, adjacent to the first well;

a plurality of shallow trench isolation structures, a first set of the plurality of shallow trench isolation structures extending into the first well and a second set of the plurality of shallow trench isolation structures extending into the second well, wherein at least one shallow trench isolation structure of the first set of the plurality of shallow trench isolation structures extends between an interface of the first well and the semiconductor substrate and at least one shallow trench isolation structure of the second set of the plurality of shallow trench isolation structures extends between an interface of the second well and the semiconductor substrate; and a deep trench isolation structure between the plurality of shallow trench isolation structures and extending into the semiconductor substrate deeper than the plurality of shallow trench isolation structures, wherein the deep trench isolation structure is between the first well and the second well, the deep trench isolation structure extending completely through the first well and the second well and into the semiconductor substrate.

2. The structure of claim 1, wherein the first well comprises an N-well and the second well comprises a P-well.

3. The structure of claim 2, further comprising diffusion regions in the first well and the second well, wherein the plurality of shallow trench isolation structures extending into the first well and the second well isolate the diffusion regions.

4. The structure of claim 3, wherein the deep trench isolation structure is at the vertical interface between the N-well and the P-well.

5. The structure of claim 4, further comprising a deep N-well within the semiconductor substrate, wherein the first well, the second well and the deep trench isolation structure sit within the deep N-well.

6. A structure comprising:

a p-well in a semiconductor substrate;

an n-well in the semiconductor substrate and abutting the p-well;

first diffusion regions in the n-well connecting to an anode;

second diffusion regions in the p-well and connecting to a cathode;

shallow trench isolation structures extending into the n-well and the p-well, a first shallow trench isolation structure of the shallow trench isolation structures extending between an interface of the n-well and the semiconductor substrate and a second shallow trench isolation structure of the shallow trench isolation structures extending between an interface of the p-well and the semiconductor substrate; and a deep trench isolation structure between the shallow trench isolation structures and which is deeper than the shallow trench isolation structures, the deep trench isolation structure extending completely through the n-well and the p-well and into the semiconductor substrate.

7. The structure of claim 6, wherein the deep trench isolation structure is provided at a junction of the n-well and the p-well.

8. The structure of claim 6, further comprising an N+diffusion extending at a junction of the n-well and the p-well, and the deep trench isolation structure is in the n-well.

9. The structure of claim 8, further comprising a silicide blocking material over the N+diffusion.

10. The structure of claim 6, further comprising a deep N-well within the semiconductor substrate, wherein the n-well, the p-second well and the deep trench isolation structure sit within the deep N-well.

11. A method comprising:

forming a first well in a semiconductor substrate;

forming a second well in the semiconductor substrate, adjacent to the first well;

forming a plurality of shallow trench isolation structures, a first set of the plurality of shallow trench isolation structures extending into the Recon the first well and a second set of the plurality of shallow trench isolation structures extending into the second well, wherein at least one shallow trench isolation structure of the first set of the plurality of shallow trench isolation structures extends between an interface of the first well and the semiconductor substrate and at least one shallow trench isolation structure of the second set of the plurality of shallow trench isolation structures extends between an interface of the second well and the semiconductor substrate; and forming a deep trench isolation structure between the plurality of shallow trench isolation structures and extending into the semiconductor substrate deeper than the plurality of shallow trench isolation structures, wherein the deep trench isolation structure is between the first well and the second well, and extending completely through the first well and the second well and into the semiconductor substrate.

* * * * *